United States Patent
Komuro et al.

[11] Patent Number: 5,851,659
[45] Date of Patent: Dec. 22, 1998

[54] SLIDING MEMBERS AND A METHOD OF PREPARATION THEREOF

[75] Inventors: Toshiro Komuro; Masaki Ooya; Teruo Imai, all of Kashiwazaki, Japan

[73] Assignee: Kabushiki Kaisha Riken, Tokyo, Japan

[21] Appl. No.: 291,075

[22] Filed: Aug. 17, 1994

[51] Int. Cl.$^6$ .................................................. F16J 9/26
[52] U.S. Cl. ..................... 428/336; 428/469; 428/472; 428/698; 428/312.2; 428/312.8
[58] Field of Search .................. 428/698, 336, 428/312.2, 312.8, 472, 469

[56] References Cited

U.S. PATENT DOCUMENTS

| | | | |
|---|---|---|---|
| 4,212,602 | 7/1980 | Buran et al. | 418/778 |
| 4,570,946 | 2/1986 | Tsuchiya et al. | 277/216 |
| 4,919,773 | 4/1990 | Naik | 204/192.15 |
| 4,943,486 | 7/1990 | Uchiyama | 428/469 |
| 5,160,537 | 11/1992 | Terrat et al. | 106/36 |
| 5,226,975 | 7/1993 | Denton et al. | 148/220 |
| 5,316,321 | 5/1994 | Ishida et al. | 277/235 A |

FOREIGN PATENT DOCUMENTS

| | | |
|---|---|---|
| 62-120471 A | 6/1987 | Japan . |
| 1-52471 B | 11/1989 | Japan . |
| 6-10454 B | 2/1994 | Japan . |
| 2 243 162 | 10/1991 | United Kingdom . |
| 2 243 162 | 1/1993 | United Kingdom . |
| 2257771 | 1/1993 | United Kingdom . |

OTHER PUBLICATIONS

Dongdong Wang et al., *Thin Solid Films,* vol. 185, No. 2, Mar. 1990, "The morphology and orientation of Cr–N films deposited by reactive ion plating".

*Chemical Abstracts,* vol. 110, No. 16, 17 Apr. 1989, "Characterization of sputtered chromium nitride coatings".

Translation of JP 4–64, published Jan. 6, 1992.

*Primary Examiner*—Archene Turner
*Attorney, Agent, or Firm*—Kubovcik & Kubovcik

[57] ABSTRACT

A sliding member, in which the surface of a substrate is coated with a compound containing at least chromium nitride, wherein a columnar crystal structure is present in a tension fracture surface of the coating, the columns being aligned toward the coating surface from the substrate surface. The coating is formed on the substrate by contacting the substrate with a gas phase mixture containing chromium and nitrogen in a PVD process. In a preferred embodiment the PVD process is an ion plating process. The coating has superior resistance to peeling, abrasion and baking. The sliding member can be used as an engine part or a compressor part.

6 Claims, 4 Drawing Sheets

F I G. 4
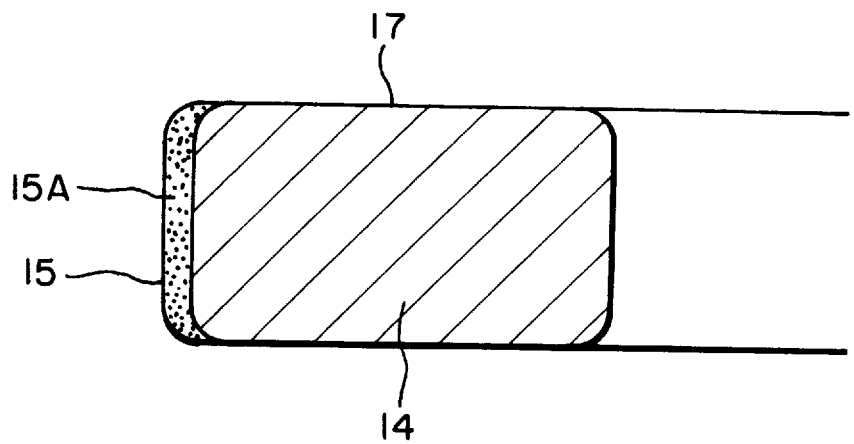
F I G. 5
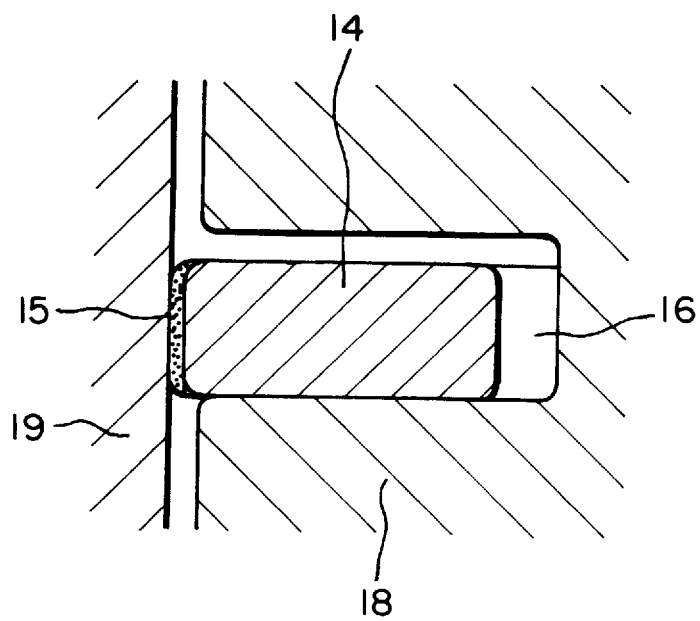

SLIDING MEMBERS AND A METHOD OF PREPARATION THEREOF

DESCRIPTION

1. Industrial Field of Utilization

This invention relates to sliding members and a method for preparation thereof. In particular, it relates to a piston ring with a chromium nitride based coating, having good abrasion and baking resistance for use in an internal combustion engine.

2. Prior Art

In sliding members used in sliding parts of motor car engines or in various machinery, a coating having good sliding properties is formed on the sliding portion by surface treatment. As surface treatments, nitride treatment, Cr plating treatment and Mo flame spraying treatment are known in the prior art. However, the sliding properties demanded of the sliding member are becoming more severe owing to high load conditions and in some cases the prior art surface treatments cannot cope. Therefore a coating having improved abrasion and baking resistance is desirable. To satisfy these requirements, one solution is to coat the sliding member with metal nitride or metal carbide by using a Physical Vapor Deposition process (hereafter referred to as PVD). PVD coatings such as TiN, TiC and CrN exhibit good abrasion and baking resistance. In particular, TiN and CrN are widely used as the coating layer in practice and are employed in machine and engine parts.

However, conditions of use have recently become still more severe and, even if TiN and CrN are used, conditions occur in which they do not provide good sliding properties. In particular, when the contact surfaces are separated by a vibrating motion normal to the surface, or when the sliding conditions in use are severe, for example when a loading normal to the surface is changed by the vibrating motion, the hard coating layers in which the chromium nitride coating layer is contained may be peeled off and the life of the sliding member is shortened. Also when the temperature in use is high or when no film of lubricating oil forms on the sliding parts because of a high contacting force, peeling of the hard coating layer may be observed. In such cases a sliding member having a ceramic coating layer that gives better peeling off resistance than the surface treatments used at the present time is desirable.

An outer surface of a piston ring engages an inner surface of a cylinder liner when the piston ring is present in a ring groove of a piston which is placed in the cylinder of an engine for back and forth motion. The thickness of a lubricating oil film produced on the surface of the cylinder is controlled and the combustion chamber is sealed by the piston. The piston is cooled by transmitting combustion heat to the cylinder liner. Accordingly, abrasion resistance, baking resistance, heat resistance, oil retention and minimal abrasion of the cylinder wall are required properties of a piston ring.

To satisfy these requirements, piston rings having good endurance, abrasion resistance and heat resistance are presently formed from iron based materials, in which surface treatment is carried out to improve the sliding properties. Known surface treatments in the prior art include nitride treatment, Cr plating treatment and Mo flame spraying treatment. A piston ring treated with the PVD process, in which the sliding surface is coated with metal nitride or metal carbide, is disclosed in the Japanese patent publications Hei 1-52471 (KOKOKU) and Sho 62-120471 (KOKAI) as the specific example of surface treatment. Good abrasion and baking resistances are exhibited in the coatings of this metal nitride and metal carbide and it is noticed that titanium nitride and chromium nitride are especially suitable for the engine.

However, the conditions required for piston rings are becoming still more severe at the present time owing to the high power and capacity of engines and cases occur in which the surface treatments of the prior art cannot cope. A development of the surface treatment is desirable to produce piston rings having good abrasion resistance.

For instance, though a coating layer of titanium nitride or chromium nitride is excellent, conditions arise in which the sliding properties of these ceramic coating layers are insufficient, namely, problems arise wherein the coating layer peels away from the outer surface of the piston ring. Therefore a piston ring coating in which the ceramic coating has a better resistance to peeling than that of the prior art is desirable.

Accordingly, the object of this invention is to provide a sliding member, particularly a piston ring coating, having good resistance to abrasion, baking and peeling under the severe conditions used; and a method for preparation thereof.

SUMMARY OF THE INVENTION

The invention provides a sliding member, in which the surface of a substrate is coated with a compound containing at least chromium nitride, characterized in that a columnar crystal structure is present in a tension fracture surface of the coating, the columns being aligned towards the coating surface from the substrate surface.

The composition of the coating is preferably CrN, $Cr_2N$ or a mixture thereof in a uniform phase. A foundation layer of chromium may be present between the substrate and the coating. Preferred characteristics of the coating are a porosity of from 1.5% to 20% and a microhardness of from 600 HmV to 1000 HmV. The crystals of the coating may be oriented with the (111) face parallel to the surface. The coating is typically between 1 µm and 80 µm thick.

The invention also provides a method of preparing such a sliding member by using a PVD process such as ion plating to form a coating on the substrate.

When compared with coatings used in the prior art, resistance to peeling off, abrasion and baking of the coating are superior in this invention. Members coated in accordance with this invention can be suitably used as engine parts such as piston ring and cam follower or compressor parts such as shoe disc and the cutting tool.

Research has shown that when a gas phase mixture of Cr and $N_2$ is contacted with a substrate in t he PVD process, a chromium nitride based layer containing CrN as the main component, and in which $Cr_2N$ is contained, is formed on the substrate surface. A crystal in a tension fracture surface of the coating layer forms a columnar structure oriented towards the coating surface from the substrate surface. Coating porosity is limited to 1.5 –20%, and a good sliding member coating, which does not peel and has good abrasion and baking resistance, is obtained.

The substrate to be coated is preferably selected from iron based materials, aluminium base d materials and titanium based materials.

The PVD process explained in detail hereafter involves a lower temperature process, when compared with the Chemical Vapor Deposition (CVD) process. However, heating cannot be avoided in vapor deposition so the use of iron based materials and titanium materials is preferable for the substrate. When the sliding member is a piston ring, as the substrate to be coated stainless steels such as 13 Cr and 17 Cr, panel steels, tool steels, and the nitride treated and Cr plating materials thereof can be used.

When the chromium nitride based layer is highly dense, the coating becomes brittle and peeling off may easily occur. The theoretical density of CrN is 6.14 g/cm$^3$ but more than 1.5% porosity of the coating is needed to prevent the peeling off the coating. Conversely, when the porosity of the coating is too high, its hardness becomes low and its abrasion resistant property is degraded. Accordingly an upper limit of 20% porosity of the coating is needed. The porosity of the coating is easily calculated by measuring the density of the coating obtained and comparing it with the theoretical density.

The coating hardness is affected by the crystal structure of the coating, the porosity, and the crystal orientation. The hardness is from about 600 to 1000 as HmV, when measured from the surface. When the crystal is oriented with the (111) face parallel to the sliding surface, it is more effective to improve the peeling resistance. It is preferable that the thickness of the coating is from 1 to 80 $\mu$m: particularly a thickness from 35 to 50 $\mu$m is preferable. When the thickness is less than 1 $\mu$m, the life of the coating becomes short through abrasion and when the thickness is more than 50 $\mu$m, the coating peels off, cracking of the coating occurs and its adhesion strength is degraded. Also it is not commercially desirable to thicken the coating more than necessary.

In the case of a piston ring, the thickness of the coating is more than 1 $\mu$m in view of the possibility that the surface layer may disappear through abrasion at a first stage of operation, whereas the coating must be retained after the first stage of operation. Meanwhile, it is not commercially desirable to thicken the coating more than necessary and when the thickness becomes greater than 60 $\mu$m, the coating easily cracks and its adhesive strength is degraded. Accordingly 60 $\mu$m or less is preferable for the thickness. However, in applications in which abrasion resistance and endurance are needed, it is possible to form the coating with a thickness of up to 80 $\mu$m.

In this invention, the gas phase mixture Cr and $N_2$ is brought into contact with the substrate. PVD processes are one way of forming the coating and can be basically divided into 3 processes: vapor deposition, sputtering and ion plating. In this invention the reactive ion plating process, in which the substrate is coated with the chromium nitride coating produced with reacting of the vapor Cr and $N_2$, is most preferable and the vapor of Cr is obtained by applying a high energy beam such as a HCD gun or electron beam to chromium. Also the Cr vapor may be obtained by producing the Cr particles from a negative pole, for example in negative pole arc plasma ion plating and sputtering methods.

When a plasma is developed in the gas phase mixture of Cr vapour and $N_2$, Cr is ionized, combines with the nitrogen ions and produces a chromium nitride based compound. A chromium nitride based coating then forms on the substrate surface. When the amounts of $N_2$ supplied are large, the composition CrN is obtained. When the amounts of $N_2$ supplied are small, the composition $Cr_2N$ is obtained and when the amounts of $N_2$ supplied are still smaller, unreacted Cr is obtained.

In the following, this invention is explained by applying the ion plating process. However, the invention is not limited to this process.

First the substrate is washed with a solvent to remove dirt attached to the surface and the substrate is inserted into a vacuum chamber in the ion plating apparatus after refining the substrate. The internal pressure of the chamber is reduced to between $1.3 \times 10^{-3}$ Pa and $5 \times 10^{-3}$ Pa and the chamber is heated to 300°–500° C., preferably with a heater present in the apparatus, to release gas contained in the substrate. After that the chamber is cooled to 100°–400° C. When the internal pressure of chamber becomes $4 \times 10^{-3}$ Pa or less, Cr ions are emitted from a target of chromium, being the negative pole of a generating arc discharged at the target surface. In these circumstances the substrate is supplied with a bias voltage of preferably 700–900 V and active treatment and the oxide removing treatment of the substrate surface are done by so-called bombardment cleaning.

After that, the bias voltage is lowered, Cr ions are accumulated on the substrate surface, and nitrogen gas is introduced into the chamber and passed through the plasma. The nitrogen gas is ionized by this procedure and an ion plating layer is formed on the substrate surface with an applied bias voltage of 0–100 V under the nitrogen partial pressure of between $1.3 \times 10^{-1}$ Pa and 13.3 Pa. After the coating is formed, the sliding member is removed from the chamber by cooling the chamber to 200° C. or less. The porosity of the coating can be controlled by adjusting the pressure used.

According to the method mentioned above, a chromium nitride based coating having specified porosity, good abrasion resistance and baking resistance and showing the columnar crystal structure in the tension fracture surface of the coating can be formed on the sliding surface of the sliding member.

The method in which the chromium nitride coating is formed on the substrate is explained in the above. However, it is possible to make a metal foundation layer lie between the coating and the substrate. During formation of the coating in the above-mentioned method and before the nitrogen gases are introduced, when the ion plating is done, the metal foundation layer of Cr is formed on the substrate. The coefficient of heat expansion of this metal Cr foundation layer is nearly equal to that of the substrate, therefore the metal Cr foundation layer is not affected by heat stress, and accordingly this foundation layer adheres and deforms well. It is preferable to make the thickness of the foundation layer between 0.1 $\mu$m and 2 $\mu$m: when the thickness is less than 0.1 $\mu$m, the improvement in adhesive properties is weak but the effect is sufficiently exhibited by a thickness of more than 0.1 $\mu$m. A thickness exceeding 2 $\mu$m gives no greater effect so it is not commercially desirable.

When a foundation layer having good adhesive and deformation properties is provided between the coating and the substrate, peeling of the coating is effectively prevented.

DRAWINGS

FIG. 4 is a sectional view of a piston ring according to the invention.

FIG. 5 is a sectional view of the ring of FIG. 4 fitted to a piston.

EXAMPLE 1

Figure 1:
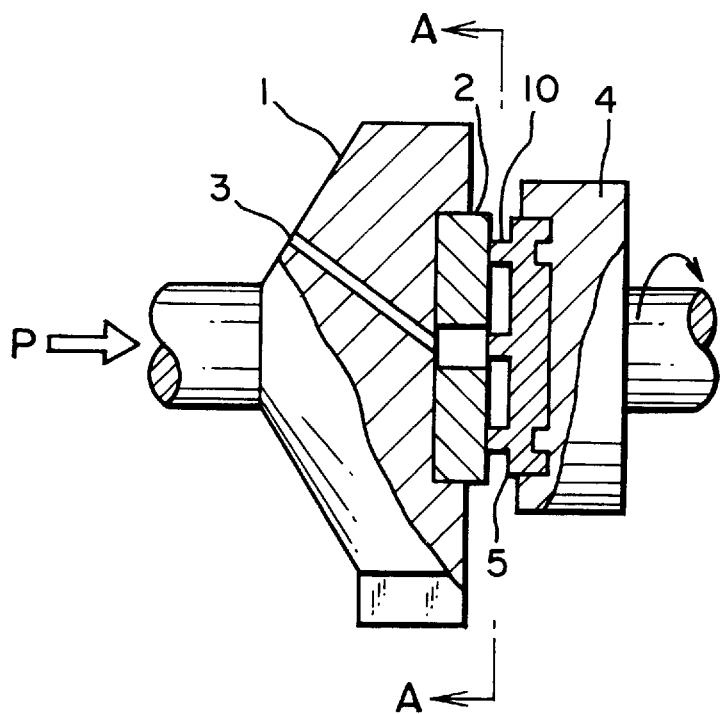
FIG. 1 illustrates the super pressure abrasion test apparatus for a frangibility test.

In this example, the material SUS440 was used as the substrate and a negative pole arc plasma ion plating apparatus was used in a PVD process. The substrate was washed with Freon and inserted into the vacuum chamber in the ion plating apparatus. The internal pressure of the chamber was reduced to $1.3 \times 10^{-3}$ Pa and it was heated to 300°–500° C. to remove the gases contained in the substrate, after which the chamber was cooled to 200° C. When the internal pressure of the chamber became less than $4 \times 10^{-3}$ Pa, a bias voltage of 700–900 V was applied and Cr ions were emitted by generating an arc electric discharge. The partial pressure of nitrogen gas introduced to the chamber was then increased to approximately $1.3 \times 10^{-1}$ Pa, a bias voltage of 0–100 V was applied and an ion plating layer having 5 μm thickness formed on the substrate surface. After formation of the coating, the sliding member was cooled in the vacuum chamber to less than 200° C.

The structure of the tension fracture surface of the coating, the composition, the porosity and the microhardness of surface were examined in the coating obtained. The second electronic figure of the tension fracture surface of the coating was observed with a scanning electron microscope and the columnar crystals oriented towards the coating surface from the substrate were confirmed. Also the composition was examined by X-ray diffraction analysis and it was confirmed that a single phase of CrN had formed and was oriented with the (111) face parallel to the sliding surface. The porosity was 3.9% and the surface hardness was 770 HmV.

EXAMPLES 2, 3 AND COMPARISON EXAMPLE 1

The baking resistance was estimated for the member of this invention by using a test piece 5, in which three pin projections 10 comprising the material SKD61 and having length 5 mm×width 5 mm×height 5 mm were placed at equal intervals on a concentric circle. A 10 μm thick coating according to this invention was formed on the 5 mm square end surface of the projections and the baking resistance test was done by using a super high pressure abrasion test apparatus. The coating of the test piece was formed by the method described in Example 1. The crystals of the tension fracture surface showed columns oriented towards the coating surface from the substrate surface, with the (111) face parallel to the sliding surface and the single phase CrN. The porosity of the coating was 3.9% in Example 2 and 2.3% in Example 3. In Example 2, the microhardness of the coating was HmV 720 and in Example 3 HmV 845.

As the comparison Example, a test piece was used, in which a 100 μm thickness of Cr plating was formed on the 5 mm square end surface of a pin projection, and the same test was done.

Figure 2:
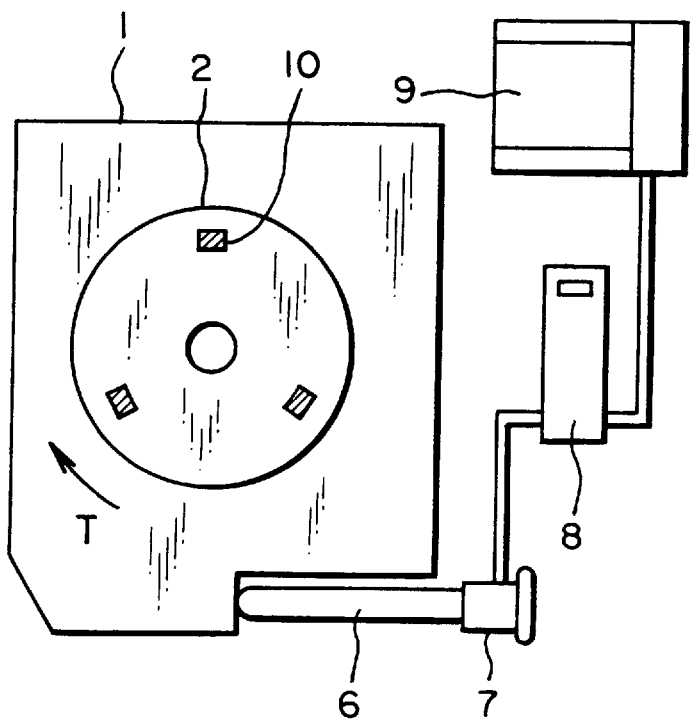
FIG. 2 is a sectional view on line A—A of FIG. 1.

The test conditions and the super high pressure abrasion test apparatus are as follows, the test apparatus being illustrated in outline by FIGS. 1 and 2.

Lubricating oil is provided at the center of a disc 2, through an oil entrance in its rear side. The disc is made of a complementary material with the dimensions diameter 80 mm×thickness 10 mm and is detachably fitted in a stationary holder 1. The designated pressure P is applied to the right side as viewed in the Figure by a hydraulic apparatus not shown. A rotor 4 is present opposite the disc 2 and is rotated at the designated speed by a driving apparatus not shown in the Figure. The test piece 5 is placed in the rotor 4 so as to slide freely, with the sliding surface being the surface treated layer formed on the 5 mm square ends of the pin projections 10.

In this apparatus, the designated pressure P is applied to the stationary holder 1, the pin projections 10 contact the disc 2 at the surface, pressed at the designated pressure, and the rotor 4 is rotated while supplying the oil to the sliding surface from the oil entrance at the designated rate (if supplying oil). The pressure applied to the stationary holder 1 is increased stepwise at regular intervals and the torque T on the stationary holder 1 resulting from friction between the test piece 5 and the disc 2 due to rotating the rotor 4 is transmitted to a load cell 7 through a rod 6. Changes thereof are read with a distortion meter 8 and are recorded on a recorder 9. When the torque T suddenly increases, it is considered that baking has occurred and the baking resistance is judged by the contact surface pressure at this point. Iron based FC25 material is used as the complementary material.

The test conditions were as follows:

Friction speed: 8 m/s

Complementary material: FC 25

Contact surface pressure: From an initial pressure of 20 kg/cm², the pressure was increased in steps of 10 kg/cm² at 3 minute intervals until baking occurred.

Lubricating oil: motor oil #30.

Oil temperature: 80° C.

Oil supply rate: 250 cm³/minute.

The results obtained are shown in Table 1.

TABLE 1

| | Pressure when baking occurred |
|---|---|
| Example 2 | 280 kg/cm² |
| Example 3 | 283 kg/cm² |
| Comparison Example 1 | 253 kg/cm² |

When FC25 material was used as the complementary material, baking occurred at the contact surface pressures of 280 and 283 kg/cm². When compared with the contact surface pressure 253 kg/cm² in the Cr-plating of the comparative material, the baking resistance was excellent.

EXAMPLE 4 AND COMPARISON EXAMPLE 2

The corrosive abrasion test was done with the Kakenshiki test apparatus. The substrate material was SKD-61, the test piece had the dimensions length 5 mm×width 5 mm×height 20 mm with a curvature of R6 mm in one end surface, in which surface the crystals of the tension fracture surface were in the columnar structure oriented towards the coating surface from the substrate surface, with the (111) face parallel to the sliding surface and a single phase of CrN. The coating of Example 4 had a porosity of 3.9%, a thickness of 10 μm and a microhardness of HmV 770. As the comparison example, a Cr-plated test piece having a thickness of 100 μm at the curved end surface was used and the same test was done. In the test, the two curved surfaces were both placed in contact with a line in an outer surface of a drum shaped complementary member, the designated load was added and rotated at the designated speed. Lubrication was done by dropping a constant volume of $H_2SO_4$ aqueous solution adjusted to pH 2 and the atmosphere was acidic.

The test conditions were as follows:

Sliding complementary material: FC 25.

Friction speed: 0.25 m/s.

Friction time: 6 hours.

Contact loading: 4 kg.

Atmosphere: $H_2SO_4$ aqueous solution adjusted to pH 2.0 was dropped on the sliding portion at the rate of 1.5 $cm^3$/minute.

The abrasion of the coatings is shown in Table 2, in which the abrasion measurements are expressed as values relative to 100 for the Cr-plating coating.

TABLE 2

|  | Surface coating | Amount of abrasion |
| --- | --- | --- |
| Example 4 | Chromium nitride | 4.3 |
| Comparison Example 2 | Cr-plated | 100 |

When compared with the Cr-plated coating, the abrasion with this invention was greatly reduced to about 1/30.

EXAMPLES 5 AND 6 AND COMPARISON EXAMPLE 3

Figure 3:
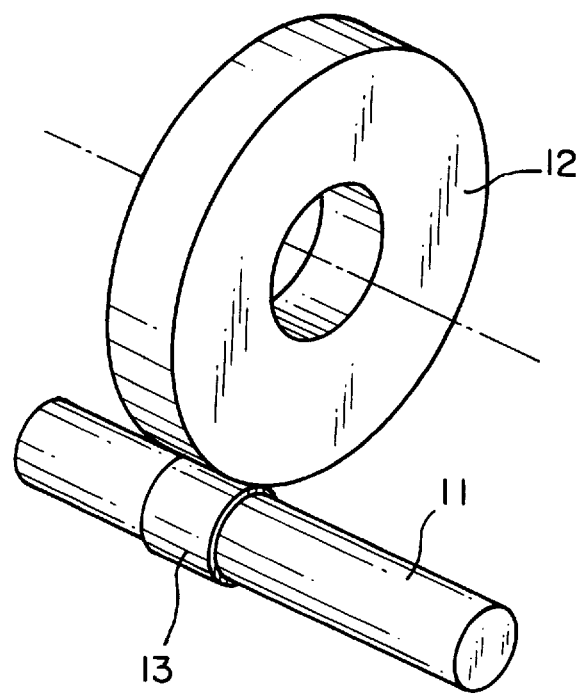
FIG. 3 shows in outline a rolling fatigue test apparatus.
Figure 7:
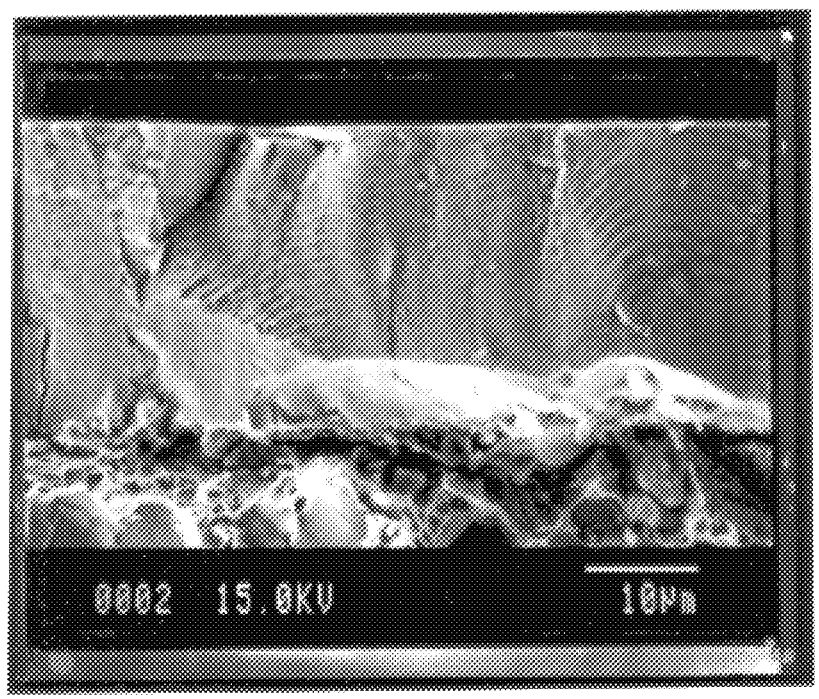
FIG. 7 is a photomicrograph of a metallic structure not having the columnar crystal structure, from a coating used in a comparison examples 3 and 6.

The peeling test of the coating of this invention was estimated by using the roller pitching test apparatus which is the roller fatigue test apparatus incorporating sliding. The substrate material of the test piece was SCM20 treated with a cementation and having roller dimensions $\phi$26 mm×28 mm. The outer surface of the test piece was coated with the coating of this invention in a thickness of 45 μm, formed by the method explained in Example 1. In Example 5, the structure of the tension fracture surface was columnar crystals oriented towards the coating surface from the substrate surface with the (111) face parallel to the sliding surface, and the porosity of the coating was 3.9%. In Example 6, the structure of the tension fraction surface was columnar crystals oriented towards the coating surface from the substrate surface and the porosity of the coating was 2.3%. The microhardness of the coatings was HmV 770 in Example 5 and HmV 845 in Example 6. As the comparison example, a coating having a thickness of 42 μm, with a non-columnar crystal in the tension fracture surface, a porosity as low as 0.2% and a CrN composition was formed on the surface of the same test piece as in Examples 5 and 6, and the resistance to peeling was measured as in Examples 5 and 6. Refer to FIG. 7 for the non-columnar crystal of the comparison example 3. The pitching test apparatus and the test conditions used in this test are as follows, illustrated in outline by FIG. 3:

The load roller 12 is present adjacent to the test roller 11, to which the test piece 13 having dimensions $\phi$26 mm×28 mm is attached, and the designated pressure is applied. The test roller 11 is rotated at the designated speed by driving apparatus (not shown) and the surface treated phase is formed on the outer surface of the test piece 13. The load roller 12 has dimensions $\phi$130 mm×18 mm, the outer periphery has a transverse curvature of R300 mm, and is in point contact with the test piece 13 microscopically so great pressure can be applied. Also the load roller 12 is moved, via a gear wheel (not shown), relative to the test roller 11 so there is relative sliding therebetween. The sliding rate is given by $(U_{13}-U_{12})/U_{13}$, where $U_{13}$ is the peripheral speed of the test piece and $U_{12}$ is that of the load roller and can be suitably selected. Lubricating oil is poured on the contact portions of the test piece 13 and the load roller 12 through an oil pouring entrance. In this apparatus, the designated pressure is applied to the test piece 13 and the test piece 13 contacts the load roller 12 at the designated pressure. The lubricating oil is poured into the contact portion at the designated rate and the load roller 12 is rotated at the designated sliding rate by rotating the test roller 11 at the designated speed.

In the test, the surface of the test piece is carefully observed and its peeling resistance is judged by the aggregate number of rotations when the surface of the test piece first peels off. The complementary material of the load roller is FC25.

The test conditions were as follows:

Surface pressure (hertz pressure): 160 kgf/$mm^2$.
Peripheral speed of the test piece: 82 m/s.
Sliding rate: 20%.
Oil used: #30 (base oil).
Oil flow rate: 1200 $cm^3$/minute.
Oil temperature: 80° C.

The test results are shown in Table 3.

TABLE 3

|  | Aggregate rotations when peeling occurred |
| --- | --- |
| Example 5 | More than 2 × $10^7$ rotations |
| Example 6 | 2 × $10^7$ rotations |
| Comparison Example 3 | 3 × $10^3$ rotations |

When compared with Comparison example, the peeling resistance was better in this invention.

EXAMPLE 7

A piston ring 14 according to the present invention and a cross section of the coating 15A are illustrated in FIG. 4. Coating of the outer peripheral sliding surface 15 of the piston ring 14 is essential and a coating may also be formed on the inner peripheral surface 16 or the upper and lower surfaces 17.

FIG. 5 is a cross sectional view in which the piston 18 furnished with the piston ring 14 is located in a cylinder liner 19.

Figure 6:
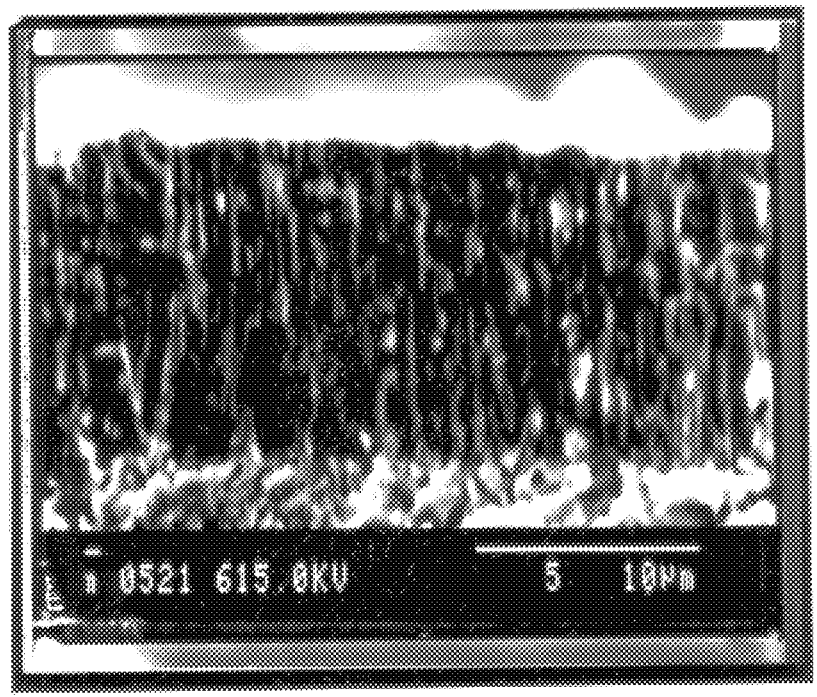
FIG. 6 is a photomicrograph of the metallic structure in a coating of the outer peripheral surface of a piston ring according to the invention.

A photomicrograph of the metal structure is illustrated in FIG. 6, in which the columnar crystals are present in the tension fracture surface of the coating, oriented towards the coating surface from the substrate surface.

In Example 7, a piston ring having nominal size $\phi$95 mm×2.5 mm width×3.4 mm thickness and made from SUS 440 material was used.

A negative pole arc plasma ion plating apparatus was used in the PVD process. The piston ring substrate was washed with Freon and inserted into the vacuum chamber in the ion plating apparatus. After reducing the pressure in the chamber to 1.3×$10^{-3}$ Pa, the gases present in the piston ring substrate were removed by heating to 300°–500° C. with the heater present in the apparatus. Afterwards the ring was cooled to 200° C.

When the chamber pressure became 4.0×$10^{-3}$ Pa or less, a bias voltage of 700–900 V was applied, an arc discharge was generated, and Cr ions were emitted. Next, nitrogen was introduced to the chamber at a partial pressure of from 1.3×$10^{-3}$ to 13.3 Pa and the ion plated coating was formed on the outer peripheral sliding surface of the piston ring by applying 0–100 V of bias voltage. After formation of the coating, the piston ring was cooled to less than 200° C. and removed from the vacuum chamber. With the above-mentioned method, a coating having 40 μm thickness and CrN composition was formed on the outer peripheral surface of the piston ring, in which the columnar structure of the crystal was present in the tension fracture surface of the coating, oriented towards the coating surface from the substrate surface and with the (111) face parallel to the outer peripheral sliding surface. The second electronic figure of the tension fracture surface of the coating in the piston ring thus obtained was observed with a scanning electron microscope and the photomicrograph is shown in FIG. 6. It is confirmed that the columnar structure of the crystals oriented towards the coating surface from the substrate surface is present, that the composition of the crystals is CrN and that the crystals are oriented with the (111) face towards the outer peripheral coating surface of the ring.

EXAMPLES 8, 9 AND COMPARISON EXAMPLE 4

With the same method as Example 7 coatings were formed on the outer peripheral surfaces of the piston rings and the closed adhesion property of the piston rings was examined. In Example 8, the coating had a CrN composition and a thickness of 40 μm, in which the columnar crystal structure was present in the tension fracture surface of the coating and oriented with the (111) face parallel to the outer peripheral sliding surface. In Example 9, the coating had a $Cr_2N$ composition and a thickness of 40 μm, in which the tension fracture surface of the coating had the columnar structure, oriented towards the coating member surface from the substrate surface.

The measurement of the closed adhesion property was a so-called twist test wherein one side of the fitting portions of the piston ring was fixed, the other side was twisted and the angle of twist was measured when peeling of the coating occurred. As in Comparison Example 4, a ring in which the coating had a thickness of 42 μm and a uniform complex ion plating of Cr and chromium nitride was formed on a piston ring having the same material and the same dimensions as Example 7. The closed adhesion property of comparison example 4 was examined in the same way as Examples 8 and 9.

The results of the measurement in Examples 8 and 9 and Comparison Example 4 are shown in Table 4, in which the measurement is expressed relative to a value of 1.0 for the angle of Comparison Example 4.

TABLE 4

|  | Relative angle at which peeling occured |
| --- | --- |
| Example 8 (CrN) | 7.32 |
| Example 9 ($Cr_2N$) | 1.17 |
| Comparison Example 4 | 1.00 |

It is clear from Table 4 that the twist angle at which peeling occurred was large aid the closed adhesion property was excellent in the coating of this invention when compared to the comparison example.

EXAMPLES 10, 11 AND COMPARISON EXAMPLES 5, 6

With the same method as Example 7, coatings comprising crystals oriented with the (111) face parallel to the outer peripheral sliding surface were formed on the outer peripheral surface of the piston rings. In Example 10, the coating had a CrN composition and a thickness of 40 μm, with the columnar structure of the crystal present and oriented towards the coating surface from the substrate surface in the tension fracture surface of the coating. In Example 11, the coating had a $Cr_2N$ composition and a thickness of 40 μm on the outer peripheral surface of the piston ring, including the columnar structure of the crystal oriented towards the coating surface from the substrate surface in the tension fracture surface of the coating.

The piston rings thus formed were put into the top ring in a diesel engine having 4 cycles and 4 cylinders. The test using an experimental apparatus was done on a table under the following conditions:

Rotation speed: 4000 rpm

Test time period: 100 hours

Oil temperature: 120° C.

Water temperature: 100° C.

A supercharger having an inter-cooler was furnished in the engine.

The abrasion of the outer peripheral sliding surface was measured 3 times in the test using the experimental apparatus. The results are shown in Table 5. As a comparison examples, a Cr-plated coating having a thickness of 100 μm (Comparison Example 5) and a chromium nitride ion plated coating having a thickness of 42 μm and not comprising the columnar structure (see FIG. 7) in the tension fracture surface of the coating (Comparison Example 6) were formed on the outer peripheral sliding surface of the piston ring and the test using the experimental apparatus was done in the same way as Examples 10 and 11. The results are shown in Table 5.

TABLE 5

|  | Abrasion (μm) | | |
| --- | --- | --- | --- |
|  | First | Second | Third |
| Example 10 (CrN) | 3.5 | 3.7 | 3.6 |
| Example 11 ($Cr_2N$) | 3.7 | 4.0 | 3.9 |
| Comparison Example 5 | 21.2 | 18.9 | 19.3 |
| Comparison Example 6 | 4.1 | 4.5 | 4.1 |

In Table 5, it is clear that the abrasion of the piston ring coated according to this invention is reduced to ⅕ when compared with that of the Cr-plated piston ring and is reduced to ⅘ when compared with that of the piston ring coated with the chromium nitride ion plating process. In the diesel engine, sulphur present in a fuel mixes with the engine oil during combustion of the fuel and oxidation of the oil is increased. Accordingly, the piston ring is not only frictional and abrasive but is also exposed to an atmosphere that accelerates corrosion and abrasion. A piston ring coated with the coating of this invention displays superior resistance to friction, abrasion and corrosion.

EXAMPLES 12, 13 AND COMPARISON EXAMPLE 7

Coatings were formed on the outer peripheral surfaces of piston rings using the same method as Example 7. In Example 12, the coating had a thickness of 40 μm, a CrN composition and the columnar crystal structure oriented towards the coating surface from the substrate surface in the tension fracture surface of the coating, in which the crystals were oriented with the (111) face parallel to the outer peripheral sliding surface. In Example 13, the coating had a thickness of 40 μm, a $Cr_2N$ composition and a columnar crystal structure oriented towards the coating surface from the substrate surface in the tension fracture surface of the coating. The piston ring was put into the top ring of a diesel engine having 4 cycles and 4 cylinders and the test was done using experimental apparatus under the following conditions:

Rotation speed: 4000 rpm

Test time period: 100 hours

Oil temperature: 120° C.

Water temperature: 100° C.

A super charger having an inter-cooler was furnished in the engine.

Peeling of the outer peripheral sliding surface of the piston ring was observed in the test using the experimental apparatus. The results are shown in Table 6.

As a comparison example, a piston ring formed with a coating having a thickness of 42 µm and comprising a complex ion plated coating having a uniform phase of chromium nitride and Cr and not having the columnar structure in the tension fracture surface of the coating (Comparison Example 7) was tested as Examples 12 and 13. The result is shown in Table 6.

TABLE 6

|  | Peeling of each cylinder | | | |
| --- | --- | --- | --- | --- |
|  | 1st | 2nd | 3rd | 4th |
| Example 12 (CrN) | No | No | No | No |
| Example 13 (Cr$_2$N) | No | No | No | No |
| Comparison Example 7 | Yes | Yes | Yes | Yes |

As shown in Table 6, the piston rings coated with the coating of this invention did not peel in each case and were remarkably improved when compared with a piston ring having chromium nitride coated with the ion plating process and a non-columnar crystal structure in the tension fracture surface.

EXAMPLE 14

A piston ring having nominal dimensions φ95 mm×2.5 mm width×3.4 mm thickness and made of SUS440 material was used in this example. A negative pole arc plasma ion plating apparatus was used in the PVD process.

The piston ring substrate was washed with Freon and inserted into the vacuum chamber of the ion plating apparatus. After reducing the chamber pressure to $1.3 \times 10^{-3}$ Pa, the gases present in the piston ring substrate were removed by heating to 300°–500° C. with the heater present in the apparatus and subsequent cooling to 200° C.

When the chamber pressure became $4.0 \times 10^{-3}$ Pa or less, a bias voltage of 700–900 V was applied, an arc discharge was generated and Cr ions were emitted. Afterwards, the nitrogen was introduced to the chamber at a partial pressure of about $1.3 \times 10^{-3}$–13.3 Pa and an ion plated coating was formed on the outer peripheral sliding surface of the piston ring by applying a bias voltage of 0–100 V. After the coating had formed, the piston ring was cooled to less than 200° C. and removed from the vacuum chamber.

With the above-mentioned method, a coating having a thickness of 40 µm, a porosity of 3.9% and a chromium nitride composition was formed on the outer peripheral surface of the piston ring, in which the columnar crystal structure was present, oriented towards the coating surface from the substrate surface in the tension fracture surface of the coating (Example 14). The porosity of the coating was calculated by measuring precisely the weight before and after the coating and dividing the difference by the coating volume. A second electronic figure of the tension fracture surface of the coating was observed with a scanning electron microscope and the photomicrograph is shown in FIG. 6. It is confirmed that crystals having a columnar structure are present and oriented towards the coating surface from the substrate surface.

EXAMPLES 15, 16 AND COMPARISON EXAMPLE 8

Using the same method as Example 14, coatings were formed on the outer peripheral surfaces of piston rings. In Example 15, the coating had a CrN composition, a porosity of 3.9% and a thickness of 40 µm, the columnar crystal structure being present in the tension fracture surface of the coating, oriented towards the coating surface from the substrate surface. In Example 16, the coating had a CrN composition, a porosity of 2.3% and a thickness of 40 µm.

The closed adhesion properties of the piston ring coatings thus formed were measured using the twist test described in relation to Examples 8 and 9 above. As Comparison Example 8, a ring having the same material and the same dimensions as Example 14 and a chromium nitride coating having a porosity of 0.2% and a thickness of 38 µm was formed and the closed adhesion property of the coating was measured in the same way as Examples 15 and 16. The results obtained in Examples 15, 16 and Comparison Example 8 are shown in Table 7, in which the measured value is expressed as a value relative to a twist angle of 1.0 for Comparison Example 8. The microhardness of each coating is also indicated.

TABLE 7

|  | Relative twist angle | Microhardness (HmV) |
| --- | --- | --- |
| Example 15 | 1.33 | 770 |
| Example 16 | 1.15 | 885 |
| Comparison Example 8 | 1.00 | 1680 |

As shown in Table 7, when the coating of this invention is compared with Comparison Example 8, the twist angle at which peeling occurred was large and the closed adhesion property was superior.

EXAMPLES 17, 18 AND COMPARISON EXAMPLES 9, 10, 11

Using the same method as Example 14, coatings were formed on the outer peripheral surfaces of piston rings. In Example 17, the coating had a thickness of 42 µm, a porosity of 3.9% and a CrN composition, in which the columnar structure of the crystal was present, oriented towards the coating surface from the substrate surface in the tension fracture surface of the coating and with the (111) face parallel to the outer peripheral sliding surface. In Example 18, the coating had a thickness of 40 µm, a porosity of 2.3% and a CrN composition. The piston rings obtained were put into the top ring of a diesel engine having 4 cycles and 4 cylinders and the test was done using the experimental apparatus under the following conditions:

Rotation speed: 4000 rpm

Test time period: 100 hours

Oil temperature: 120° C.

Water temperature: 100° C.

A supercharger having an inter-cooler was furnished in the engine.

The abrasion of the outer peripheral sliding surface was measured 3 times in the experimental apparatus and the results are shown in Table 8.

As comparison examples, piston rings were coated and the same tests were done as Examples 17 and 18. Comparison Example 9 comprised a Cr-plated coating having a thickness of 100 μm. Comparison Example 10 comprised a chromium nitride ion plated coating having a thickness of 42 μm and a porosity of 0.2%. Comparison Example 11 comprised a CrN coating having a thickness of 40 μm and a porosity of 23.5%. These results are also shown in Table 8.

TABLE 8

|  | Abrasion (μm) | | |
| --- | --- | --- | --- |
|  | First | Second | Third |
| Example 17 | 3.8 | 4.1 | 3.9 |
| Example 18 | 3.6 | 3.8 | 3.7 |
| Comparison Example 9 | 21.2 | 18.9 | 19.3 |
| Comparison Example 10 | 4.0 | 4.2 | 4.0 |
| Comparison Example 11 | 5.2 | 4.9 | 5.1 |

As shown in Table 8, when the piston ring coated with the coating of this invention was compared with a piston ring having a Cr-plated coating, abrasion was reduced to ⅕, and when compared with a piston ring coated with the chromium nitride produced by the ion plating process and having high density and low porosity, abrasion was equal or less. A chromium nitride coating having larger porosity than the coating of this invention displayed less resistance to abrasion than the coating of this invention.

EXAMPLES 19, 20 AND COMPARISON EXAMPLE 12

Using the same method as Example 14, coatings were formed on the outer peripheral sliding surfaces of piston rings. In Example 19, the coating had a CrN composition, a thickness of 42 μm and a porosity of 3.9%, in which the columnar crystal structure was present in the tension fracture surface of the coating, oriented towards the coating surface from the substrate surface, and with the (111) face parallel to the outer peripheral sliding surface. In Example 20, the coating had a thickness of 40 μm, a porosity of 2.3% and a CrN composition. The piston rings obtained were put into the top ring of a diesel engine having 4 cylinders and 4 cycles and the test was done using the experimental apparatus under the following conditions:

Rotation speed: 4000 rpm

Test time period: 100 hours

Oil temperature: 120° C.

Water temperature: 100° C.

A supercharger having an inter-cooler was furnished in the engine.

The state of peeling in the outer peripheral sliding surfaces was observed.

As a comparison example, a piston ring having a chromium nitride coating with a thickness of 42 μm and a porosity of 0.2% was formed (Comparison Example 12) and the test was carried out using the same method as Examples 19 and 20. The results are shown in Table 9.

TABLE 9

|  | Peeling of each cylinder | | | |
| --- | --- | --- | --- | --- |
|  | 1st | 2nd | 3rd | 4th |
| Example 19 | No | No | No | No |
| Example 20 | No | No | No | No |
| Comparison Example 12 | Yes | Yes | Yes | Yes |

As shown in Table 9, peeling of the coatings did not occur in the piston rings coated with the coating of this invention but peeling did occur in the piston ring coated with chromium nitride having the small porosity produced by the ion plating process. The piston ring with the coating of this invention was remarkably resistant to peeling.

We claim:

1. A sliding member in which the surface of a substrate is coated with a coating of CrN (111) having a porosity of between 1.5% and 20%, characterized in that a columnar crystal structure is present in a tension fracture surface of the coating, the columns being aligned towards the coating surface from the substrate surface.

2. A sliding member according to claim 1, wherein the crystals of the chromium nitride based coating are oriented with the (111) face parallel to the surface of the coating.

3. A sliding member according to claim 1, wherein the microhardness of the coating is between 600 HmV and 1000 HmV when measured from the surface of the coating.

4. A sliding member according to claim 1, wherein a foundation layer of chromium is present between the coating and the substrate.

5. A sliding member according to claim 1, in which the thickness of the coating is between 1 μm and 80 μm.

6. A sliding member according to claim 1, wherein the chromium nitride of said coating comprises CrN, $Cr_2N$ or a mixture thereof.

* * * * *